United States Patent
Matsumoto et al.

[11] Patent Number: 5,770,511
[45] Date of Patent: Jun. 23, 1998

US005770511A

[54] SILICON-ON-INSULATOR SUBSTRATE AND A METHOD FOR FABRICATING THE SAME

[75] Inventors: Kei Matsumoto; Hirotaka Kato; Hiroshi Furukawa, all of Hiratsuka, Japan

[73] Assignee: Komatsu Electronic Metals Co., Ltd., Kanagawa, Japan

[21] Appl. No.: 729,870

[22] Filed: Oct. 15, 1996

[51] Int. Cl.$^6$ .................................................. H01L 21/76
[52] U.S. Cl. ........................ 438/406; 438/455; 438/459; 438/476
[58] Field of Search .................................. 438/455, 471, 438/476, 406, 459

[56] References Cited

U.S. PATENT DOCUMENTS

| | | | |
|---|---|---|---|
| 5,194,395 | 3/1993 | Wada | 438/143 |
| 5,238,875 | 8/1993 | Ogino | 438/459 |
| 5,443,661 | 8/1995 | Oguro et al. | 438/402 |
| 5,478,408 | 12/1995 | Mitani et al. | 438/459 |

*Primary Examiner*—Trung Dang
*Attorney, Agent, or Firm*—Welsh & Katz, Ltd.

[57] ABSTRACT

The present invention, a silicon-on-insulator (SOI) substrate and its fabrication method, is suited to the wafer-bonding method. A pre-oxidation treatment accompanying the oxidation treatment and the adhesive thermal treatment to prevent metal impurities from polluting semiconductor wafers. Before an oxide layer is thermally grown on one wafer or after two bonded wafers are subjected to a adhesive thermal treatment at a temperature T1, the pre-oxidation treatment is performed at a temperature of T2, which satisfies the relation equation of T1−300≦T2≦T1−100 (°C.). Water steam, pure oxygen, or diluted oxygen, is conducted into the furnace, in which the pre-oxidation treatment is performed in an oxidation ambient. Accordingly, an oxide film having a predetermined thickness is formed on the surface of the SOI substrate serving as a barrier for preventing metal impurities, such as Fe, Cr, or the like, from invading the substrate and degrading the electrical characteristics thereof.

4 Claims, 2 Drawing Sheets

SILICON-ON-INSULATOR SUBSTRATE AND A METHOD FOR FABRICATING THE SAME

BACKGROUND OF THE INVENTION

1. Field of the Invention

The present invention relates to a silicon-on-insulator (SOI) substrate and a method for fabricating the same.

2. Description of the Related Art

As compared with the method for fabricating integrated circuits on a bulk semiconductor substrate, the method of fabricating integrated circuits on a thin semiconductor layer which is deposited on an insulating material has several advantages, such as superior device characteristics, and complete isolation between the devices. From this point of view, a structure called silicon-on-insulator (SOI) is, for example configured with a single crystalline silicon layer formed on an insulating layer of $SiO_2$, which overlies a single crystalline silicon substrate. By a silicon-wafer bonding method, a silicon layer provided with high-crystallization and any desired thickness can be achievable.

According to FIG. 3, the process flow of fabricating SOI substrate by the wafer-bonding method is schematically depicted in the following steps:

(1) Oxidation to the surface of a first wafer 1 thermally grows an oxide layer 2 to a predetermined thickness;

(2) The first wafer 1 with the grown oxide layer 2 is bonded with a second wafer 3 as a supporting substrate at room temperature;

(3) Those bonded wafers are subjected to adhesive thermal treatment for assuring the adhesion strength therebetween; and (4) The first wafer 1 is subjected to processes of polishing and etching so as to form a silicon layer 4 having a predetermined thickness.

By the aforementioned wafer-bonding method, both the oxidation treatment in step (1) and the adhesive thermal treatment in step (3) are performed under thermal parameters as shown in FIG. 4. In the drawing, either the first wafer 1 or the bonded wafers are placed in a furnace. Then, the temperature within the furnace is heated to and held at greater than 1000° C. (T1) for 5–6 hours at longest. During such thermal processes, some metal impurities, for instance, Fe, Cr, or the like, contained in jigs and ambient or even more adherent on the surface are liable to diffuse into the substrate. Those metal impurities, also called lifetime killers, will degrade the electrical characteristics of semiconductor material. Therefore, the polluting metal impurities, during the thermal processes, should be blocked as much as possible from diffusing into the substrate.

SUMMARY OF THE INVENTION

Therefore, the present invention provides an SOI substrate and its fabrication method which can prevent metal impurities from polluting the substrate when oxidation thermal treatment and the subsequent adhesive thermal treatment are performed.

For attaining the above-identified objects, the present invention provides a method for fabricating a silicon-on-insulator by a wafer-bonding method, when forming an oxide layer on at least one side of a semiconductor wafer comprises the following steps of: first being subjected to one pre-oxidation treatment to prevent invasion by metal impurities; and then being subjected to an oxidation treatment to form the oxide layer to a predetermined thickness.

Moreover, when bonding the SOI substrate, the method in accordance with the present invention comprises: first subjecting at least one side of the wafer to another pre-oxidation treatment to prevent invasion by metal impurities; and then being subjected to an adhesive thermal treatment. Those pre-oxidation treatments are performed under a oxygen-containing ambient at a temperature lower than that of the subsequent the oxidation thermal treatment.

Furthermore, the present invention provides a silicon-on-insulator substrate which is subjected to a pre-oxidation treatment and an thermaloxidation treatment before or/and after two wafers are bonded together.

By those pre-oxidation treatments, an oxide film is formed to overlie the semiconductor wafer. In addition, because the temperature applied to the pre-oxidation treatment is lower than that of the oxidationthermal treatment, the quantity of metal impurities invading the wafer can be minimized as much as possible. Accordingly, such a method prevents metal impurities from invading the wafer while performing the oxidationthermal treatment. In accordance with the present invention, a high-quality SOI substrate less polluted by metal impurities is feasible.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENTS

Figure 1:
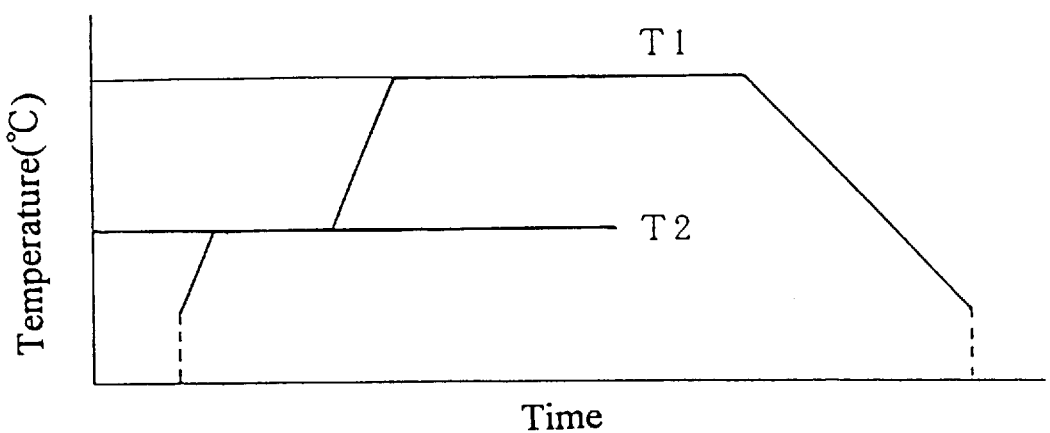
FIG. 1 depicts the temperature curve of fabricating an SOI substrate in accordance with the present invention while the thermal process is being applied.

As depicted in FIG. 1, the temperature parameters during the thermal process utilized by the present invention is shown. The thermal process depicted in FIG. 1 is suitable for either oxidation or adhesive thermal treatment after the wafer-bonding step.

At first, as the oxidation process is exemplified, the first wafer 1 is placed into a furnace and then subjected to a pre-oxidation process at a temperature of T2. The temperature T2 relative to the subsequent regular temperature T1 ($\geq 1000°$ C.) satisfies the relation equation of T1−300$\leq$T2$\leq$T1−100 (°C.). Meanwhile, water steam, pure oxygen, or diluted oxygen is conducted into the furnace, and, therefore, the surface of the wafer 1 is thermally oxidized at a thermal oxidation ambient. However, the oxidation speeds under the ambient of water steam, pure oxide, and diluted oxide become slower and slower in the order of water steam, pure oxide, diluted oxygen; the process time is determined thereby, respectively. Accordingly, an oxide film having a predetermined thickness is thermally grown on the first wafer 1.

After the pre-oxidation treatment, the temperature of the furnace is elevated to T1 and thermal oxidation is performed at the same ambient as the pre-oxidation treatment to form the oxide layer 2. As a predetermined time elapses, the temperature within the furnace is decreased and the first wafer 1 is taken outside the furnace.

During the pre-oxidation treatment, the oxide film having the predetermined thickness is first grown on the surface of the wafer 1. The oxide film serves as a barrier to prevent metal impurities from invading the wafer's interior even though the wafer 1 is thereafter subjected to the thermal process (oxidation thermal treatment) at a heating temperature greater than 1000° C.

After the first wafer 1 and the second wafer 3 are bonded together at room temperature, the thermal treatment, is applied when intensifying adhesion is considered. Similarly, a pre-oxidation treatment is performed to the bonded wafers at an oxygen-containing ambient of temperature T2 in order to form an oxide film thereon. Subsequently, the temperature within the furnace is elevated to T1 for performing the adhesive thermal treatment for assuring the adhesion strength therebetween. Note that the adhesive thermal treatment will not be necessarily performed with the oxygen-containing ambient. After a predetermined time elapses, the temperature within the furnace is reduced and the bonded wafers are taken outside the furnace.

The pre-oxidation treatment can be performed either before those wafers are bonded or after those wafers are bonded together. Certainly, the formed oxide film through the pre-oxidation treatment can act as the barrier to prevent metal impurities form polluting the substrate.

Figure 2:
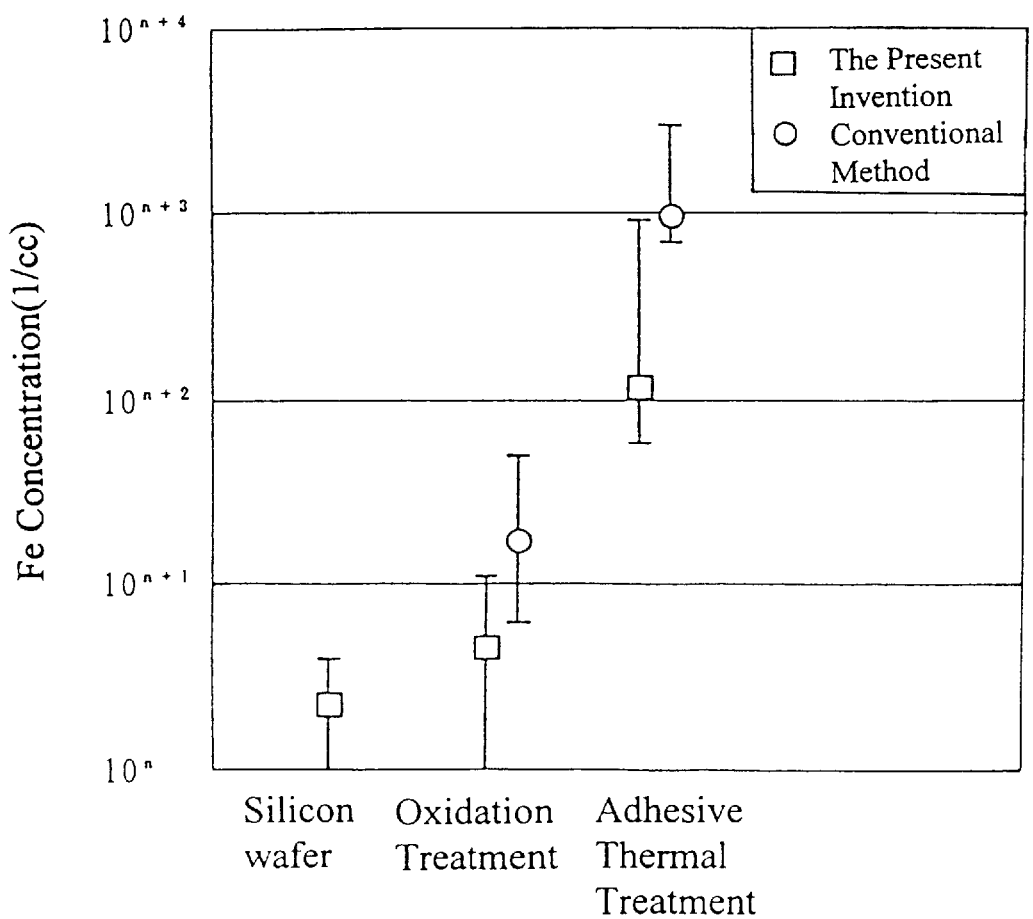
FIG. 2 depicts the distribution diagram of Fe concentration contained in the formed SOI substrates according to the present invention as compared with the conventional method.
Figure 3:
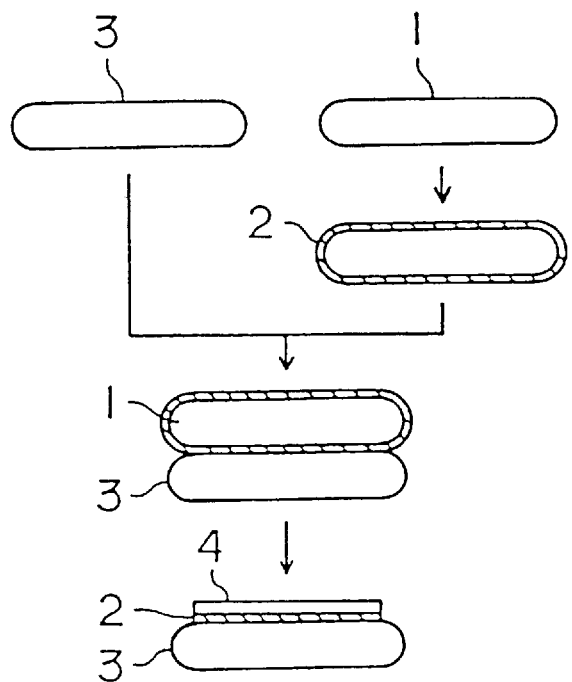
FIG. 3 schematically depicts the process flow of fabricating SOI substrate by the wafer-bonding method.
Figure 4:
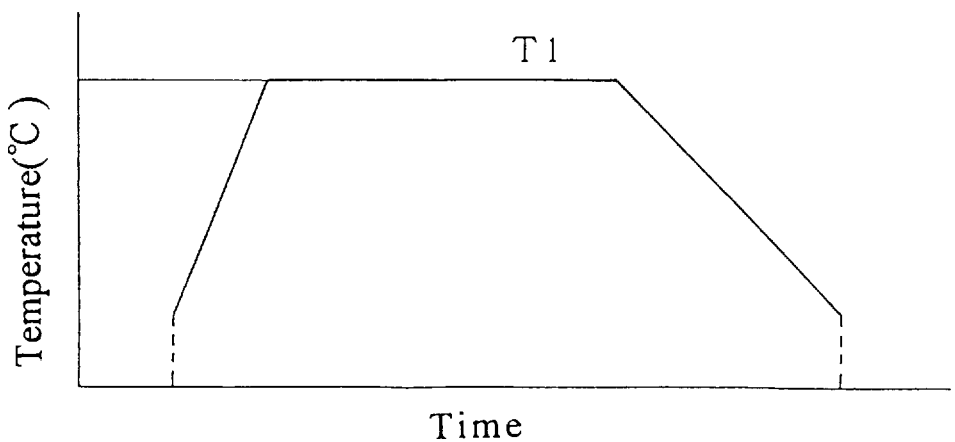
FIG. 4 depicts the temperature curve of fabricating an SOI substrate according to the conventional method.

As depicted in FIG. 2, the distribution diagram of Fe concentration contained in SOI substrates according to the present invention as compared with the conventional method is shown. The first wafer 1 and the second wafer 3 are single crystalline silicon wafers fabricated by Czochralski technique each having a diameter of 150 mm, P-type conductivity, and a spreading resistance of about 10–15Ω·cm. The pre-oxidation treatment is performed at T2=T1–100(°C.) for 60 minutes in a water steam ambient. Moreover, the temperature T1 while performing the oxidation treatment is about 1000° C., while the temperature T1 is elevated to 1100° C. while performing the adhesive thermal treatment.

The Fe concentration contained in the silicon layer 4 varies inversely with the lifetime. A depicted in FIG. 2, the SOI substrate fabricated according to the present invention demonstrates the Fe concentration contained therein, regardless of whether applying the oxidation thermal treatment or after adhesive thermal treatment, having one order less than that of the conventional method. It results from that the oxide film formed by the pre-oxidation treatment prevents invasion and diffusion by metal impurities. Therefore, the lifetime of the SOI substrate in accordance with the present invention is tremendously prolonged over that obtained by the conventional method.

In conclusion, the present invention makes use of a silicon film having a predetermined thickness formed by a pre-oxidation treatment prior to an oxidation thermal treatment or bonding thermal treatment. And the present invention is applicable of most of semiconductor fabrication processes requiring thermal oxidation treatment. Apparently, as compared with the conventional method, the pollution resulting from metal impurities during heating process can be decreased. Accordingly, the high-quality SOI substrate according to the present invention demonstrates excellent electric characteristics and a longer lifetime.

What is claimed is:

1. A method of fabricating a silicon-on-insulator substrate comprising:
   a pre-oxidation layer formation step of forming a pre-oxidation layer on a first semiconductor substrate by oxidizing the first semiconductor substrate at a first temperature;
   an oxide layer formation step of forming an oxide layer on the pre-oxidation layer by oxidizing the first semiconductor substrate on which the pre-oxidation layer is formed by the pre-oxidation layer formation step at a second temperature that is higher than the first temperature;
   a semiconductor substrate bonding step of bonding a second semiconductor substrate to the first semiconductor substrate on which the oxide layer is formed by the oxide layer formation step; and
   a thin layer formation step for making the first semiconductor substrate on which the oxide layer is formed by the oxide layer formation step and bonded to the second semiconductor substrate into a thin layer.

2. The method as claimed in claim 1, wherein the semiconductor substrate bonding step comprises:
   a stacked substrate formation step for forming stacked substrates having a bonding strength by stacking the first semiconductor substrate on which the oxide layer is formed by the oxide layer formation step on the second semiconductor;
   a second pre-oxidation layer formation step for forming a second pre-oxidation layer on the stacked substrates by oxidizing the stacked substrates at a third temperature; and
   a thermal treatment step of performing a thermal treatment to the stacked substrates on which the second pre-oxidation layer is formed by the second pre-oxidation layer formation step at a fourth temperature that is higher than the third temperature so as to increase the bonding strength between the stacked substrates.

3. The method as claimed in claim 2, wherein the third temperature is equal to the first temperature and the fourth temperature is equal to the second temperature.

4. A method of fabricating a silicon-on-insulator substrate comprises:
   an oxide layer formation step of forming an oxide layer on a first semiconductor substrate by oxidizing the first semiconductor substrate;
   a stacked substrate formation step for forming stacked substrates by stacking the first semiconductor substrate on which the oxide layer is formed by the oxide layer formation step on a second semiconductor;
   a pre-oxidation layer formation step for forming a pre-oxidation layer on the stacked substrates by oxidizing the stacked substrates at a first temperature;
   a thermal treatment step of performing a thermal treatment to the stacked substrates on which the pre-oxidation layer is formed by the pre-oxidation layer formation step at a second temperature that is higher than the first temperature so as to increase the bonding strength between the stacked substrates; and
   a thin layer formation step for making the first semiconductor substrate constituting the stacked substrates into a thin layer.

* * * * *